(12) United States Patent
Bill et al.

(10) Patent No.: US 6,459,625 B1
(45) Date of Patent: Oct. 1, 2002

(54) THREE METAL PROCESS FOR OPTIMIZING LAYOUT DENSITY

(75) Inventors: Colin S. Bill, Cupertino; Jonathan S. Su, Gabriel; Ravi P. Gutala, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/767,341

(22) Filed: Jan. 23, 2001

Related U.S. Application Data

(60) Provisional application No. 60/185,149, filed on Feb. 25, 2000.

(51) Int. Cl.[7] .............................. G11C 16/04; G11C 5/02
(52) U.S. Cl. ........................ 365/185.33; 365/63; 365/52
(58) Field of Search ............................ 365/185.05, 161, 365/164, 185.01, 185.33, 63, 52

(56) References Cited

U.S. PATENT DOCUMENTS 5,590,072 A * 12/1996 Choi ...................... 365/185.01
6,034,882 A * 3/2000 Johnson et al. ............. 365/103

* cited by examiner

*Primary Examiner*—David Nelms
*Assistant Examiner*—Thong Le

(57) ABSTRACT

The present invention discloses a method and system to optimize electrical interconnection of electrical components in a periphery area of a memory device thereby minimizing the periphery area. The periphery area is divided into a plurality of sub-circuits formed by selectively electrically connecting the electrical components. Electrical interconnection of the electrical components to form the sub-circuits is accomplished using a first metal layer and a second metal layer. The first metal layer is formed to create a plurality of first metal layer lines that are oriented to extend in substantially one direction on the memory device. The second metal layer is formed to create a plurality of second metal layer lines that are oriented to extend substantially perpendicular to the first metal layer lines. The plurality of sub-circuits are electrically interconnected using a third metal layer that is formed to create a plurality of third metal layer lines that are oriented to extend substantially parallel to the first metal layer lines.

14 Claims, 4 Drawing Sheets

THREE METAL PROCESS FOR OPTIMIZING LAYOUT DENSITY

This application claims the benefit under 35 U.S.C. §119(e) of Provisional U.S. patent application Ser. No. 60/185,149, filed Feb. 25, 2000.

FIELD OF INVENTION

The present invention relates generally to non-volatile memory devices and, more particularly, to methods and systems for optimization of layout density in a periphery area using a three-metal interconnection process in flash electrically erasable programmable read-only memory (EEPROM) devices.

BACKGROUND OF THE INVENTION

Flash memories are popular memory storage devices because they store information in the absence of continuous power and are capable of being constructed in a very compact form. Flash memory is typically constructed by fabricating a plurality of electrical components in a silicon substrate. It is desirable to place as many of the electrical components as possible in the available area on the silicon substrate to optimize functionality and economical manufacture. The density or layout area of the electrical components depends on the physical size of the electrical components and the electrical connections between components. As the size of the electrical components decreases due to technological advances, more components can be placed in the available area on the flash memory. However, more electrical components require more electrical connections that can offset the layout area gained by the smaller component size.

Flash memory devices include two functional areas, a core cell area to perform memory functions and a periphery area to perform logic functions. As known in the art, the core cell area includes rows and columns of electrical components that are floating-gate transistors formed in the silicon substrate during fabrication. The floating-gate transistors located in the core cell area of the flash memory are typically referred to as core memory cells. The rows of core memory cells within the core cell area are typically electrically connected to form wordlines and the columns of core memory cells within the core cell area are typically electrically connected to form bitlines. As known in the art, the wordlines and bitlines are used to provide predetermined operational voltages to erase, read and write the core memory cells within the core cell area.

In addition to the core cell area, the flash memory also has a periphery area that includes a plurality of electrical components such as transistors, resistors, capacitors and diodes formed in the silicon substrate during fabrication. As known in the art, the resistors, capacitors and diodes may be formed during fabrication to create electrical components such as bipolar and field-effect transistors. The electrical components are electrically connected to form integrated circuits that perform logic functions within the flash memory to support operations such as the read, write and erase of the core memory cells. Part of the formation of the electrical connections of the electrical components occurs during a fabrication process known in the art as metallization.

Generally, metallization involves depositing a thin film of conductive metal on the flash memory such that the electrical components are formed and electrically connected with the conductive metal. In addition to forming portions of the electrical components, the conductive metal electrically connects the electrical components in a predetermined configuration, thereby "wiring" the electrical components to create the integrated circuits. The conductive metal that electrically connects the electrical components is routed on the flash memory and contributes to the layout area consumed.

Known prior art flash memory uses a two-metal layer metallization process to electrically connect the electrical components in the periphery area of the flash memory. A first layer of metal is typically used to form portions of the electrical components and to electrically connect the electrical components to form a plurality of sub-circuits that perform predetermined logic functions during operation. A second layer of metal is typically used to electrically connect one sub-circuit with another and to electrically connect the sub-circuits with the core memory cells in the core area such that operations can be performed within the flash memory.

A known problem with this method and system of electrical connection is layout area consumed by routing channels of the first and second layer of metal between the sub-circuits in the periphery area. In addition, layout area is consumed for routing channels that are used to route the first and second metal layers between the electrical components that form the sub-circuits. The layout area for the routing channels required by existing electrical connection systems and methods increases the size of the periphery area on the flash memory. The area on the flash memory that is not consumed by the periphery area can be reserved for the core cell area, allowing more core memory cells to be fabricated on the flash memory. It is therefore desirable to minimize the amount of periphery area consumed, thereby increasing the amount of information stored in the flash memory. That is, the ratio of the core area to the periphery area can be maximized.

To that end, a need exists for flash memory with an improved method and system of interconnection of electrical components to minimize the area consumed in the periphery area of the flash memory.

SUMMARY OF THE INVENTION

The present invention discloses a method and system of optimizing layout area consumed in a periphery area of a flash memory. The flash memory includes a core cell area and the periphery area. Within the core cell area, the flash memory includes a plurality of core memory cells; and, within the periphery area, the flash memory includes a plurality of sub-circuits. Generally, the core cell area provides memory-related functions in the flash memory and the periphery area supports the memory-related functions by providing logic-related functions in the flash memory.

The core cell area and the periphery area share the available area on the flash memory. As such, a smaller periphery area is desirable, thereby increasing the area available for the core cell area. In the preferred embodiment, selectively placing and electrically connecting a plurality of electrical components to form the sub-circuits and selectively electrically connecting the sub-circuits with the core memory cells minimizes the layout area of the sub-circuits in the periphery area.

The preferred sub-circuits include the electrical components such as transistors, resistors, capacitors and diodes that are electrically connected with a first metal layer, a second metal layer and a third metal layer. The electrical components are electrically connected to form the sub-circuits by the first metal layer and the second metal layer. The sub-circuits are electrically interconnected with each other and with the core memory cells in the core cell area by the third metal layer. Those skilled in the art would understand that, typically, the majority of electrical components in the periphery area used to create the integrated circuits are transistors; however, other electrical components such as diodes and resistors could also be utilized.

The circuit layout of the sub-circuits is such that the transistors are oriented to form a plurality of rows of transistors wherein each transistor has a drain and a source oriented along an axis parallel with the rows of transistors. In another preferred embodiment of the present invention, the drain and the source of the transistors are not oriented along an axis parallel with the rows of transistors.

The first metal layer is applied to the periphery area of the flash memory during fabrication to form and partially interconnect the electrical components in a predetermined circuit configuration. The first metal layer comprises a plurality of first metal lines that provide interconnecting surface "wiring" for the predetermined circuit configuration. The layout in the periphery area of the first metal lines is oriented to extend along an axis substantially parallel to the rows of transistors. The second metal layer also provides surface "wiring" of the electrical components to complete the predetermined circuit configuration and form the sub-circuits. The second metal layer is also applied to the periphery area of the flash memory during fabrication. The layout of the second metal layer on the flash memory is deposited to form a plurality of second metal lines that are oriented to extend along an axis substantially perpendicular to the first metal lines.

The sub-circuits are selectively electrically interconnected and electrically connected with the core memory cells in the core cell area by the third metal layer. The third metal layer is also applied to the periphery area of the flash memory during the fabrication process and is adapted to form a plurality of third metal lines. The third metal lines provide surface "wiring" to electrically connect the sub-circuits with the core memory cells and are oriented to extend along an axis substantially parallel to the first metal lines.

During the fabrication process, the periphery area consumed by the transistors, the first metal layer, the second metal layer and the third metal layer is optimized in the preferred embodiment. The orientation of the transistors uniformly in rows allows the spacing between the transistors in the rows to be minimized without causing short circuits or undesirable leakage currents while still allowing electrical connection of the transistors. In addition, the combination of the first metal layer and the second metal layer to form and electrically connect the electrical components to create the sub-circuits also minimizes the periphery area consumed.

The electrical connections with the transistors are typically located directly below the first metal lines of the first metal layer. Since the first metal lines are substantially straight, additional spacing between the rows of transistors to allow for electrical connection of the transistors to the first metal layer is minimized. The second metal lines of the second metal layer provide additional electrical connections to complete the sub-circuits, thereby minimizing bends in the first metal lines and repositioning of the electrical components under the first metal lines. The second metal lines are also substantially straight and orthogonally pass over the first metal lines, thereby minimizing noise and allowing efficient electrical connections that further minimize consumption of the periphery area. The third metal layer provides electrical connection of the first metal layer and the second metal layer with the core memory cells. As such, the third metal lines can be substantially straight and be routed on top of the sub-circuits such that consumption of the periphery area is minimized.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a flash memory.

Figure 1:
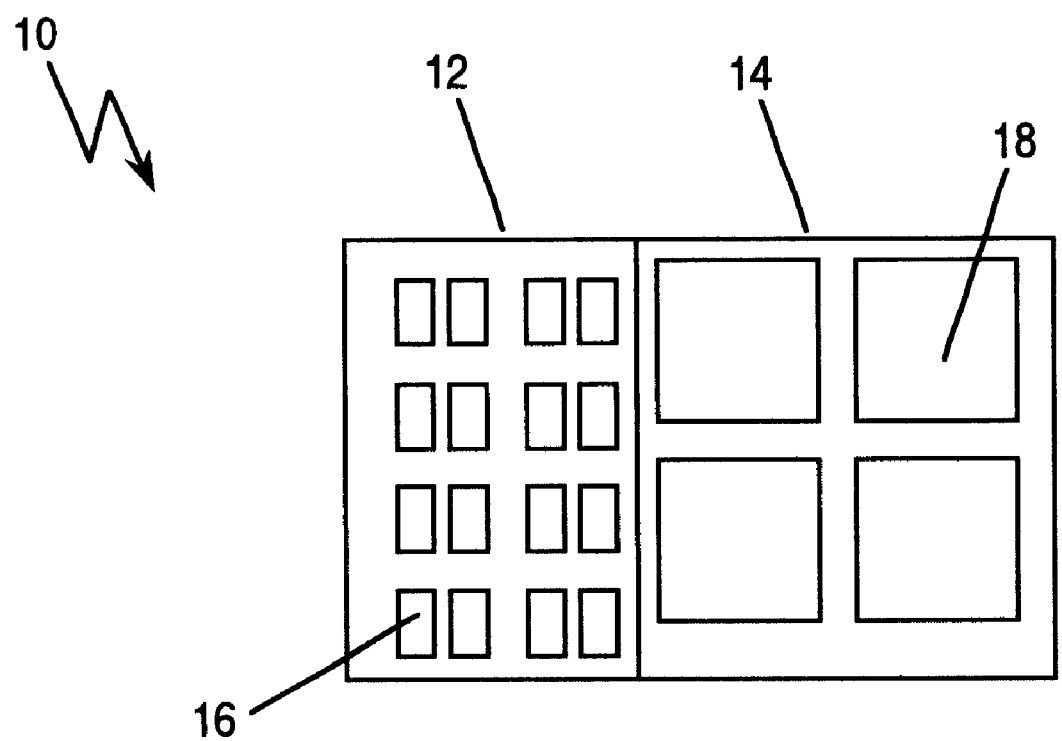
FIG. 1 represents a block diagram of a portion of a preferred flash memory incorporating an embodiment of the present invention.

FIG. 1 illustrates a general block diagram of a preferred flash memory 10 incorporating an embodiment of the present invention. The flash memory 10 includes a core cell area 12 and a periphery area 14. As known in the art, within the core cell area 12, the flash memory 10 includes a plurality of core memory cells 16. Within the periphery area 14, the flash memory 10 includes a plurality of sub-circuits 18 that are made up of various types of circuit components such as transistors, capacitors and resistors. Generally, the core cell area 12 performs memory-related functions in the flash memory 10, and the periphery area 14 supports the memory-related functions by performing logic-related functions in the flash memory 10. Although not illustrated in FIG. 1, the periphery area 14 typically includes electronic circuits such as decoder circuits, state machine circuitry, voltage regulator circuits and addressing circuits as known in the art.

In order to understand the method and system of optimizing the layout in the periphery area 14, an understanding of the operation and configuration of the periphery area 14 is helpful. Generally, during operation of the preferred flash memory 10, the sub-circuits 18 within the periphery area 14 execute a plurality of functions to assist in performing memory operations such as read, write and erase. The sub-circuits 18 are integrated electric circuits that occupy different physical areas in the periphery area 14 of the flash memory 10, and are identified based on the function the particular sub-circuit 18 performs. Those skilled in the art would recognize that the sub-circuits 18 in the periphery area 14 of the flash memory 10, as briefly set forth above, can contain many types of logic circuits and control circuits that perform a variety of functions in the flash memory 10. The present invention relates to methods of optimally placing and electrically interconnecting transistors that are used in the sub-circuits 18 to the other respective sub-circuits 18, as well as interconnecting the various electrical components used in a particular sub-circuit 18 with one another.

The physical size of the periphery area 14 occupied by the sub-circuits 18 is a predetermined area based on the physical size of the particular sub-circuits 18, which is determined on a circuit-by-circuit basis during the design phase of the flash memory 10. The design phase occurs prior to fabrication of the flash memory 10 and involves circuit design, dimensioning and circuit layout of the sub-circuits 18 on the surface of the flash memory 10. The circuit layout area of a particular sub-circuit 18 is preferentially designed using just enough area for the physical dimensions of the electrical components and interconnections as well as providing enough spacing between components and the interconnections to avoid electrical short circuits and problems with leakage current. For the best layout efficiency of the layout of transistors used in the sub-circuits 18, the transistors should have their source/drain geometries spaced apart by their minimum source/drain spacing rule. In addition, in the preferred embodiment, all of the transistors in the sub-circuits 18 are placed in rows while obeying the minimum source/drain spacing rules of the particular transistors.

Figure 2:
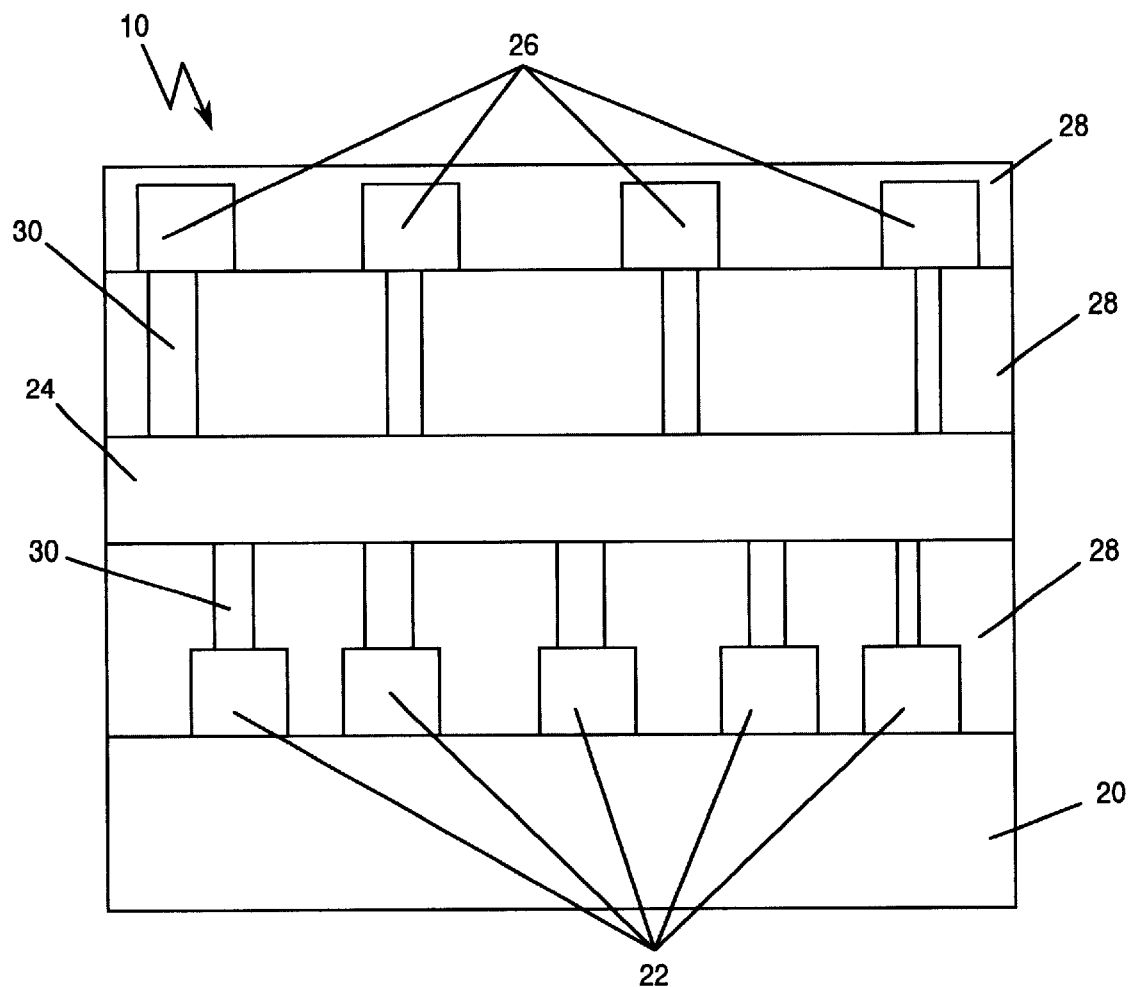
FIG. 2 generally illustrates a cross-sectional view of a portion of the preferred flash memory.

FIG. 2 generally illustrates a cross-sectional view of a portion of a preferred flash memory 10. As known in the art, the preferred flash memory 10 includes a substrate 20 where the electrical components of the flash memory 10 are formed during fabrication. In addition, the preferred flash memory 10 includes a first metal interconnect layer (M1) 22, a second metal interconnect layer (M2) 24 and a third metal interconnect layer (M3) 26, which are separated and encapsulated by a plurality of dielectric layers 28. The dielectric layers 28, which can be made using any dielectric material commonly used in the art such as oxide, silicon nitride or a polyamide film, provides an insulating layer between the first metal interconnect layer (M1) 22 and the second metal interconnect layer (M2) 24 in the preferred embodiment. In addition, the dielectric layer 28 is also used to provide an insulating layer between wiring lines formed in the respective first (M1), second (M2) and third (M3) metal interconnect layers 22, 24, 26 as set forth in detail below. One dielectric layer 28 is also deposited over the third metal interconnect layer (M3) 26 to protect the third metal interconnect layer (M3) 26.

A plurality of contact holes 30, which are also referred to in the art as vias, are created during fabrication to penetrate the dielectric layers 28 in predetermined locations of the flash memory 10. The contact holes 30 provide electrical interconnections between the first metal interconnect layer (M1) 22, the second metal interconnect layer (M2) 24 and the third interconnect layer 26 at the predetermined locations of the flash memory 10. As known in the art, once the contact holes 30 are formed, the contact holes 30 are filled with a conductive material such as copper, tungsten or any other suitable conductive material. To that end, a conductive path is created between the respective metal interconnect layers 22, 24, 26 with the contact holes 30 at predetermined locations in the preferred flash memory 10.

Figure 3:
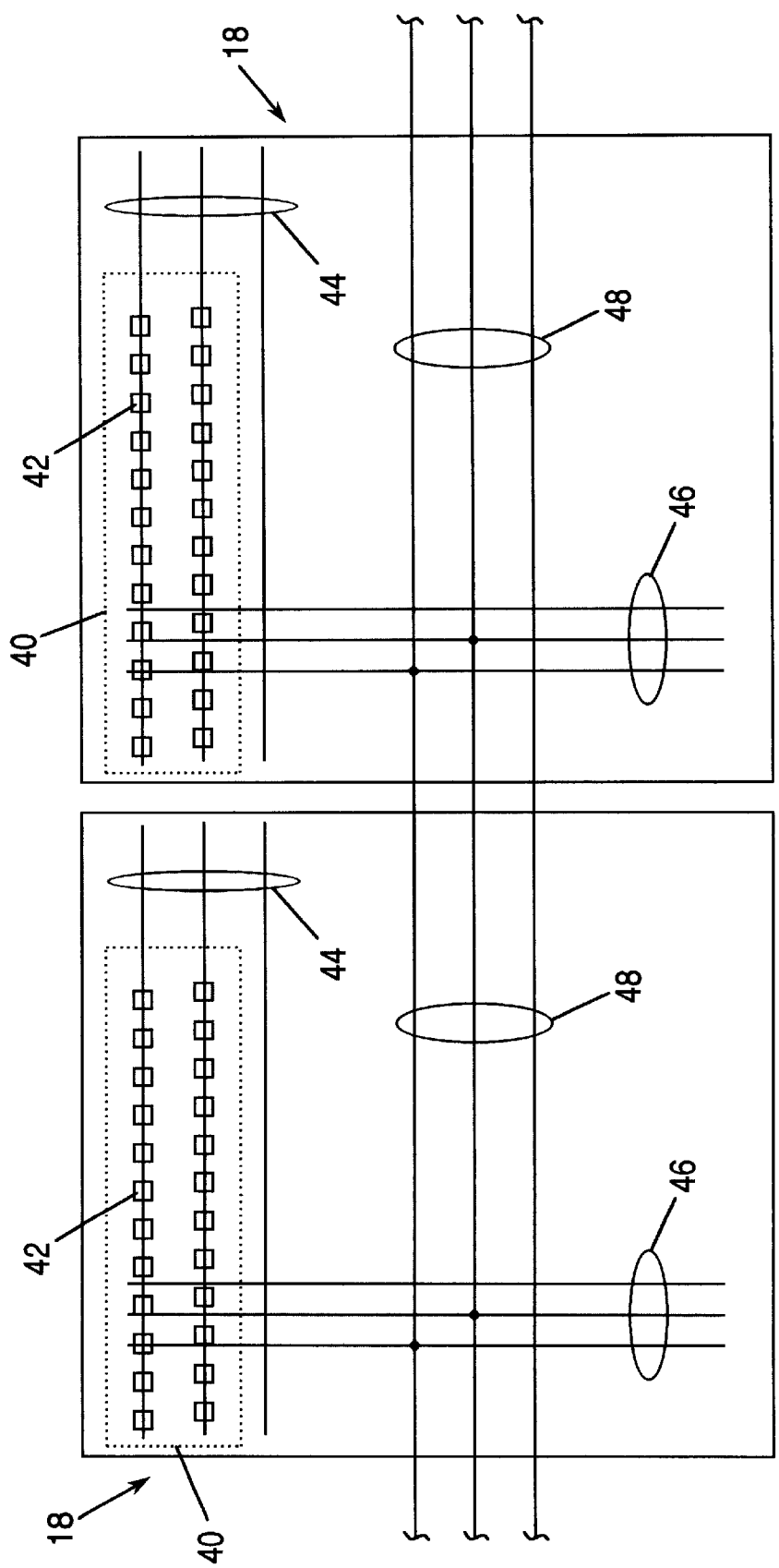
FIG. 3 illustrates a top view of two sub-circuits of the preferred flash memory.

FIG. 3 generally represents the top view of two sub-circuits 18 within the periphery area 14 of the flash memory 10. As previously set forth, the sub-circuits 18 include a plurality of electrical circuits 40, which generally include a plurality of transistors 42 and a plurality of other circuit components (not shown). Although not illustrated, those skilled in the art would recognize that other circuit components, such as resistors, capacitors and diodes may also be used in the electrical circuits 40. However, since a majority of the circuit components used in the preferred flash memory 10 are transistors 42, the present invention is directed to methods and systems that provide optimal transistor 42 layout and interconnection.

In the preferred embodiment, the individual components of the electrical circuits 40 in each sub-circuit 18 are electrically interconnected with one another in a predetermined manner to form the sub-circuits 18 by the first metal interconnect layer (M1) 22 and the second metal interconnect layer (M2) 24. The circuit component layout of the sub-circuits 18 is preferentially designed such that the transistors 42 of the electrical circuits 40 are positioned to form rows of transistors 42, wherein each transistor 42 is positioned such that its drain and source are oriented along a common horizontal axis with wiring lines formed by the first metal interconnect layer (M1) 22 as set forth in detail below.

The first metal interconnect layer (M1) 22 is deposited on the periphery area 14 of the flash memory 10 during fabrication to partially interconnect the individual circuit components of each respective electrical circuit 40 in predetermined circuit configurations. Referring to FIGS. 2 and 3, the first metal interconnect layer (M1) 22 is fabricated to form a plurality of first metal layer lines 44 that provide interconnecting surface "wiring" of the components of the electrical circuits 40. In the preferred embodiment, the first metal layer lines 44 are formed to extend along an axis substantially parallel to the rows of transistors 42 in the electrical circuits 40. Those skilled in the art would recognize that occasional deviation from the axis parallel with the rows of transistors 42 will occur to perform necessary electrical connections but, preferentially, the first metal layer lines 44 are formed parallel with the rows of transistors 42. The electrical circuits 40 are partially electrically interconnected once the first metal interconnect layer (M1) 22 is deposited during fabrication to form the first metal layer lines 44. As set forth below, the remaining electrical interconnection of the electrical circuits 40 in the sub-circuits 18 is accomplished using the second metal interconnect layer (M2) 24.

The second metal interconnect layer (M2) 24 also provides surface "wiring" of the electrical circuits 40 to complete the predetermined circuit configuration and formation of the sub-circuits 18. The second metal interconnect layer (M2) 24 is fabricated on the periphery area 14 of the flash memory 10 during fabrication in a predetermined configuration. Referring to FIGS. 2 and 3, the second metal interconnect layer (M2) 24 is fabricated to form a plurality of second metal layer lines 46 that are oriented substantially perpendicular to the first metal layer lines 44. Those skilled in the art would again recognize that occasional deviation from the axis perpendicular with the first metal layer lines 44 will occur to facilitate efficient electrical connections but, preferentially, the second metal layer lines 46 are formed to run perpendicular to the orientation of the first metal layer lines 44.

As set forth above, the electrical circuits 40 of the sub-circuits 18 are electrically interconnected with the first metal layer lines 44 and the second metal layer lines 46. As such, each circuit component and transistor 42 in the electrical circuits 40 are interconnected in a predetermined configuration using the first metal layer lines 44 and the second metal layer lines 46. The contact holes 30 are used to electrically connect the second metal layer lines 46 to respective first metal layer lines 44 and circuit components and transistors 42 on the substrate 20. Utilizing both the first metal interconnect layer (M1) 22 and the second metal interconnect layer (M2) 24 within the boundary of the sub-circuits 18 provides the greatest opportunity to place transistors 42 at their minimum spacing and yet have the metal interconnect consuming no extra area than that needed by the transistors 42. As such, this layout scheme optimizes the area consumed by the transistors 42.

The third metal interconnect layer (M3) 26 is used to electrically interconnect one respective sub-circuit 18 to another respective sub-circuit 18 in the preferred flash memory 10. The third metal interconnect layer (M3) 26 is fabricated to form a plurality of third metal layer lines 48 that electrically interconnect the respective sub-circuit 18 to each other. The third layer metal lines 48 are formed perpendicular to the second metal layer lines 46 in the preferred flash memory 10. Those skilled in the art would recognize that occasional deviation from the axis perpendicular to the second metal layer lines 46 will occur to facilitate electrical connection but, preferentially, the third metal layer lines 48 are formed perpendicular to the second metal layer lines 46.

Although not illustrated, in the preferred embodiment, the sub-circuits 18 are also electrically interconnected with the core memory cells 16 in the core cell area 12 by the third metal layer lines 48. The third metal layer lines 48 therefore provide the surface "wiring" that electrically connect the sub-circuits 18 with the core memory cells 16 and are generally oriented to extend along an axis parallel to the first metal layer lines 44. As illustrated in FIG. 2, the third metal layer lines 50 are connected with the first and second metal layer lines 44, 46 using contact holes 30 to reach the other layers. Although not illustrated, in the preferred embodiment of the present invention, those skilled in the art should recognize that the contact holes 30 can travel through more than one metal interconnect layer.

Figure 4:
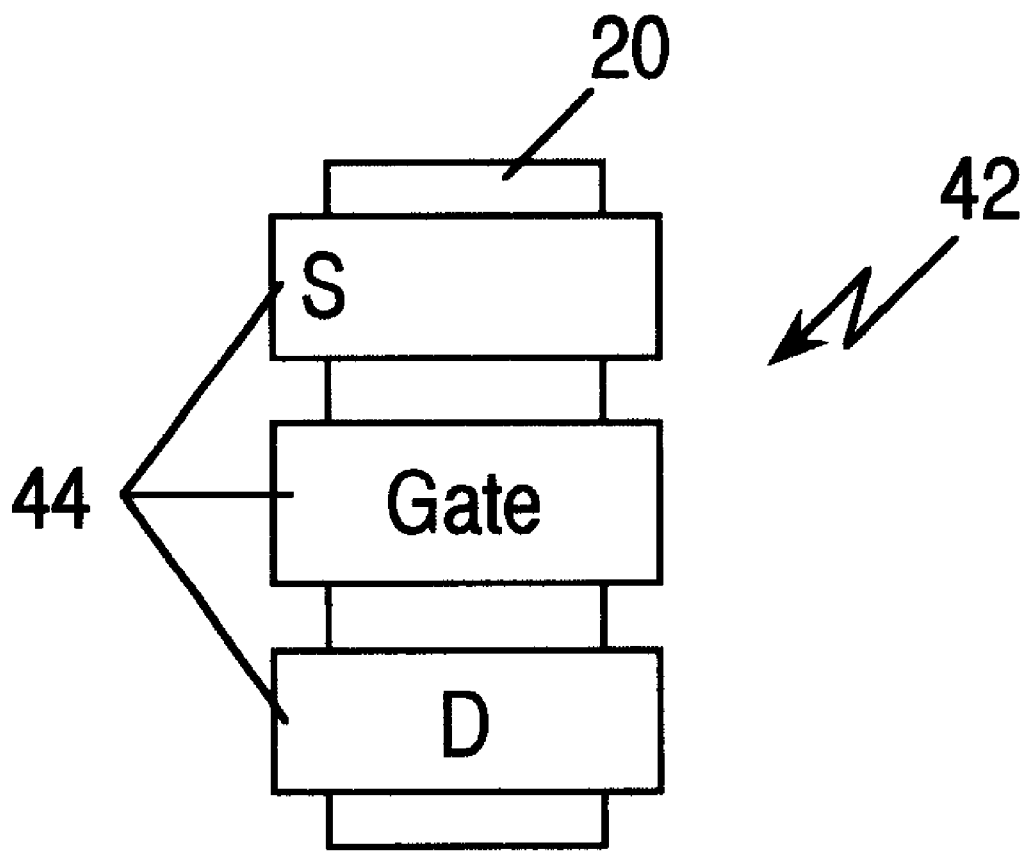
FIG. 4 illustrates the preferred source/drain orientation in relation to the first metal layer lines.

During the fabrication process, the periphery area 14 consumed by the electrical circuits 40 is optimized by using the preferred embodiment of the present invention. As previously set forth, the electrical circuits 40 include uniformly oriented rows of transistors 42 and are oriented such that the drain of a respective transistor 42 is adjacent to the source of the next transistor 42 in the rows of transistors 42. When the transistors 42 of the electrical circuits 40 are oriented in rows, the layout area between respective electrical circuits 40 is minimized without causing short circuits or undesirable leakage currents while still providing electrical interconnection of the electrical circuits 40. Referring to FIG. 4, which is an enlarged view of one of the transistors 42 illustrated in FIG. 3, the source, gate and drain of the transistors 42 used in the electrical circuits 40 are oriented substantially parallel with the first metal layer lines 44.

Using the first metal layer lines 44 that are formed by the first metal interconnect layer (M1) 22 and the second metal layer lines 46 that are formed by the second metal interconnect layer (M2) 24 to electrically interconnect the electrical circuits 40 to form the sub-circuits 18 minimizes the periphery area 14 consumed in the preferred flash memory 10. As previously set forth, the first metal layer lines 44 are oriented to extend substantially parallel with the rows of transistors 42 in the periphery area 14. In addition, the electrical connections with the drains, sources and control gates of the transistors 42 in the electrical circuits 40 are located directly below the first metal layer lines 44. Since the first metal layer lines 44 are formed substantially parallel with the transistors 42, additional layout area between the rows of transistors 42 is further minimized.

The second metal layer lines 46 formed by the second metal interconnect layer 34 provide additional electrical interconnections to complete the sub-circuits 18, thereby minimizing bends required in the first metal layer lines 44 and repositioning of the electrical components under the first metal layer lines 44. Prior art electrical interconnection connection of the sub-circuits was completed using the first metal interconnect layer, thereby requiring several bends in the first metal layer lines formed by the first metal interconnect layer or increasing the spacing between the electrical components used in the periphery area. The second metal layer lines 46 formed by the second metal interconnect layer (M2) 24 are also substantially straight and oriented substantially perpendicular to the first metal layer lines 44 in the preferred embodiment. As such, the second metal layer lines 46 uniformly pass over the first metal layer lines 44, thereby minimizing noise created by parasitic capacitance and allowing efficient electrical connections that further minimize consumption of the space available in the periphery area 14.

The electrical interconnection of the sub-circuits 18 and the core memory cells 16 by the third metal interconnect layer (M3) 26 is also optimized in the preferred embodiment. The third metal interconnect layer (M3) 26 provides electrical interconnection of the first metal interconnect layer 22, the second metal interconnection layer 24 and therefore connecting the sub-circuits 18 with the core memory cells 16. As such, the third metal layer lines 48 that are formed by the third metal interconnect layer (M3) 26 are substantially straight and routed on top of the sub-circuits 18 such that consumption of the periphery area 14 is minimized. In addition, the third metal layer lines 48 are sufficiently separated from the first metal layer lines 44 and perpendicularly pass over the second metal layer lines 46 such that noise created by parasitic capacitance is minimized.

In the prior art, the second metal interconnect layer is used to electrically connect the first metal interconnect layer with the core memory cells by routing the second metal lines of the second metal interconnect layer in routing channels between the sub-circuits. The routing of the second metal lines of the second metal interconnect layer between the sub-circuits consumes layout area between the sub-circuits, thereby enlarging the periphery area. In the present invention, no additional layout area is required between the sub-circuits 18 for the third metal interconnect layer (M3) 26 and consumption of the periphery area 14 is further minimized.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of electrically interconnecting a periphery area in a flash memory, comprising:

providing a plurality of sub-circuits fabricated in a periphery area of a silicon substrate, wherein each sub-circuit includes at least one electrical circuit having a plurality of circuit components;

partially electrically interconnecting said circuit components with a first metal interconnect layer including a plurality of first metal layer lines that are oriented substantially in one direction;

completing the electrical interconnection of said circuit components in each respective sub-circuit with a second metal interconnect layer including a plurality of second metal layer lines that are oriented substantially perpendicular to said first metal layer lines; and electrically interconnecting each respective sub-circuit with a predetermined number of other sub-circuits with a third metal interconnect layer including a plurality of third metal layer lines.

2. The method of claim 1, further comprising the step of depositing a dielectric layer between said first, second and third metal interconnect layers.

3. The method of claim 1, wherein a plurality of contact holes are used to electrically interconnect said first metal interconnect layer, said second metal interconnect layer and said third metal interconnect layer at predetermined locations.

4. The method of claim 1, wherein said circuit components include a plurality of transistors that are arranged in rows substantially parallel with said first metal layer lines.

5. The method of claim 4, wherein said transistors are at least spaced apart from each other by at least the minimum source/drain spacing rule of said transistors.

6. A method of optimizing circuit layout in a flash memory, comprising:

forming a plurality of sub-circuits in a periphery area of a silicon substrate, wherein each sub-circuit includes at least one electric circuit having a row of transistors;

depositing a first metal interconnect layer on said substrate to partially electrically interconnect the transistors of the sub-circuits, wherein said first metal interconnect layer forms a plurality of first metal layer lines that are oriented to extend substantially in the same direction as said row of transistors;

depositing a second metal interconnect layer above said first metal interconnect layer to complete the electrical interconnection of said respective transistors within said sub-circuits, wherein said second metal interconnect layer forms a plurality of second metal lines oriented to extend substantially perpendicular to said first metal layer lines; and depositing a third metal interconnect layer above said second metal interconnect layer to electrically interconnect the respective sub-circuits, wherein said third metal layer forms a plurality of metal layer lines oriented to extend substantially parallel to said first metal layer lines.

7. The method of claim 6, further comprising the step of depositing a dielectric layer between said first, second and third metal interconnect layers.

8. The method of claim 6, wherein a plurality of contact holes are used to electrically interconnect said first metal interconnect layer, said second metal interconnect layer and said third metal interconnect layer at predetermined locations.

9. The method of claim 6, wherein said transistors are at least spaced apart from each other by at least the minimum source/drain spacing rule of said transistors.

10. An electrical interconnection system to optimize layout of a periphery area in a memory device, comprising:

a plurality of sub-circuits in a periphery area of a silicon substrate, wherein each of said sub-circuits includes at least one electric circuit with a plurality of circuit components;

a first metal interconnect layer comprising a plurality of first metal layer lines that partially electrically connect the circuit components of said electric circuits, wherein said first metal layer lines are fabricated to be oriented to extend substantially in one direction;

a second metal interconnect layer comprising a plurality of second metal layer lines that complete the electrical connection of said circuit components of said electric circuits, wherein said second metal layer lines are fabricated to be oriented to extend substantially perpendicular to said first metal layer lines; and a third metal interconnect layer comprising a plurality of third metal layer lines that electrically interconnect said plurality of sub-circuits, wherein said third metal layer lines are fabricated to be oriented to extend substantially parallel to said first metal layer lines.

11. The electrical interconnection system of claim 10, wherein said plurality of electrical components comprise a plurality of transistors, a plurality of diodes and a plurality of resistors.

12. The electrical interconnection system of claim 11, wherein said plurality of transistors are oriented to form a plurality of rows of transistors that run substantially parallel with said plurality of first metal layer lines.

13. The electrical interconnection system of claim 11, wherein each of said plurality of transistors within said plurality of rows of transistors are positioned such that a drain and a source of each of said plurality of transistors is similarly oriented along an axis substantially parallel with said plurality of first metal lines.

14. The electrical interconnection system of claim 11, wherein said transistors are spaced apart by at least the minimum source/drain spacing rule of said transistors.

* * * * *